(12) United States Patent
He et al.

(10) Patent No.: US 7,001,198 B2
(45) Date of Patent: Feb. 21, 2006

(54) ANTI-WARPAGE MEANS FOR SOCKET CONNECTOR

(75) Inventors: Wen He, Kunsan (CN); FuJin Peng, Kunsan (CN); Jinfeng Lei, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/848,483

(22) Filed: May 17, 2004

(65) Prior Publication Data

US 2004/0229493 A1 Nov. 18, 2004

(30) Foreign Application Priority Data

May 16, 2003 (TW) ............................... 92209061 U

(51) Int. Cl.
*H01R 13/625* (2006.01)
*H01R 4/50* (2006.01)

(52) U.S. Cl. ........................................ 439/342; 439/83
(58) Field of Classification Search ............ 439/67–68, 439/342, 83; 361/760
See application file for complete search history.

(56) References Cited

U.S. PATENT DOCUMENTS

| | | | |
|---|---|---|---|
| 5,829,988 A | 11/1998 | McMillan et al. ............ 439/70 |
| 6,093,035 A | 7/2000 | Lemke et al. ................. 439/83 |
| 6,155,845 A | 12/2000 | Lin et al. ....................... 439/83 |
| 6,296,506 B1 * | 10/2001 | Mizumura et al. .......... 439/342 |
| 6,358,068 B1 * | 3/2002 | Houtz .......................... 439/83 |
| 6,558,181 B1 * | 5/2003 | Chung et al. ............... 439/342 |
| 6,722,910 B1 * | 4/2004 | Kajinuma ................... 439/342 |
| 2002/0192994 A1 * | 12/2002 | Turner et al. ............... 439/342 |

FOREIGN PATENT DOCUMENTS

EP 1043811 A1 * 10/2000

* cited by examiner

*Primary Examiner*—Michael C. Zarroli
(74) *Attorney, Agent, or Firm*—Wei Te Chung

(57) ABSTRACT

A socket connector (10) comprises a base (20) defining a mounting surface (20*a*) and a substantially rectangular passage body (22). The passage body defines a rectangular array of passages (22*b*). A plurality of concavities (20*d*) is defined in the mounting surface. Each concavity is defined between two adjacent passages in a same row of the passages, and surrounded by four passages; two of the passages being in a same row as the concavity, and two of the passages being in a row adjacent said same row. With this configuration, the passage body of the base has a substantially uniform thickness at the mounting surface. Thus, after molding, the passage body is simultaneously cooled down at the mounting surface, to thereby prevent the passage body from warping during formation or heating of the base.

5 Claims, 3 Drawing Sheets

ANTI-WARPAGE MEANS FOR SOCKET CONNECTOR

BACKGROUND OF THE INVENTION

1. Field of the Invention

The present invention relates to the art of socket connectors, and more particularly to anti-warpage means incorporated in a socket connector which electrically interconnects an integrated circuit (IC) package with a printed circuit board (PCB).

2. Description of the Prior Art

Generally, mast electrical components of an electrical device are secured in corresponding dielectric components. With contemporary electrical components becoming more and more complicated, the dielectric components become more intricate. It is becoming increasingly difficult to manufacture the dielectric components having a uniform thickness. As a result, in molding of one dielectric component, some relatively thick parts thereof cool down slowly, and some relatively thin parts thereof cool down quickly. This results in inner stresses in the dielectric component.

When the dielectric component is soldered onto a PCB or used in relatively high temperature conditions, said inner stresses are liable to warp the dielectric component. If this happens, it is difficult to correctly position electrical components in the dielectric component. In addition, the reliability of the electronic device is reduced.

FIG. 4 shows a typical socket connector 60, which comprises a dielectric base 62, a cover 64 slidably mounted on the base 62, a plurality of contacts (not shown) received in the base 62, and an actuating device 66 movably embedded in the base 62 and the cover 64. The base 62 comprises a passage body, and a head extending from one end of the passage body. The passage body defines an array of passages 62a arranged in columns and rows.

Referring also to FIG. 5, each passage 62a has a substantially "T"-shaped profile when viewed from a top elevation, and secures a corresponding contact therein. It can be seen that thicknesses between adjacent passages 62a are not uniform.

As a result, after molding of the base 62, some relatively thick parts thereof cool down slowly, and some relatively thin parts thereof cool down quickly. Thus inner stresses are created in the base 62. When the socket connector 60 is soldered onto a printed circuit board (not shown), said inner stresses may be released and may warp the base 62. When this happens, a tempering process is needed in order to calibrate the base 62 to the required shape. This inflates manufacturing costs of the socket connector 60.

What is needed is anti-warpage means for a socket connector that solves the above-mentioned problems.

SUMMARY OF THE INVENTION

Accordingly, an object of the present invention is to provide an anti-warpage means for a socket connector which helps prevent a base of the socket connector from warping during formation or heating of the base.

To fulfill the above-mentioned object, a socket connector with anti-warpage means according to the present invention is provided. The socket connector comprises a base, a plurality of contacts received in the base, a cover slidably mounted on the base, and actuating device embedded in the base and the cover. The base defines a mounting surface and a substantially rectangular passage body. The base defines a rectangular array of passages for receiving corresponding contacts therein. The anti-warpage means is a plurality of concavities defined in the mounting surface. Each concavity is defined between two adjacent passages in a same row of the passages, and surrounded by four passages; two of the passages being in a same row as the concavity, and two of the passages being in a row adjacent said same row. With this configuration, the passage body of the base has a substantially uniform thickness at the mounting surface. Thus, after molding, the passage body is simultaneously cooled down at the mounting surface, to thereby prevent the passage body from warping during formation or heating of the base.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Figure 1:
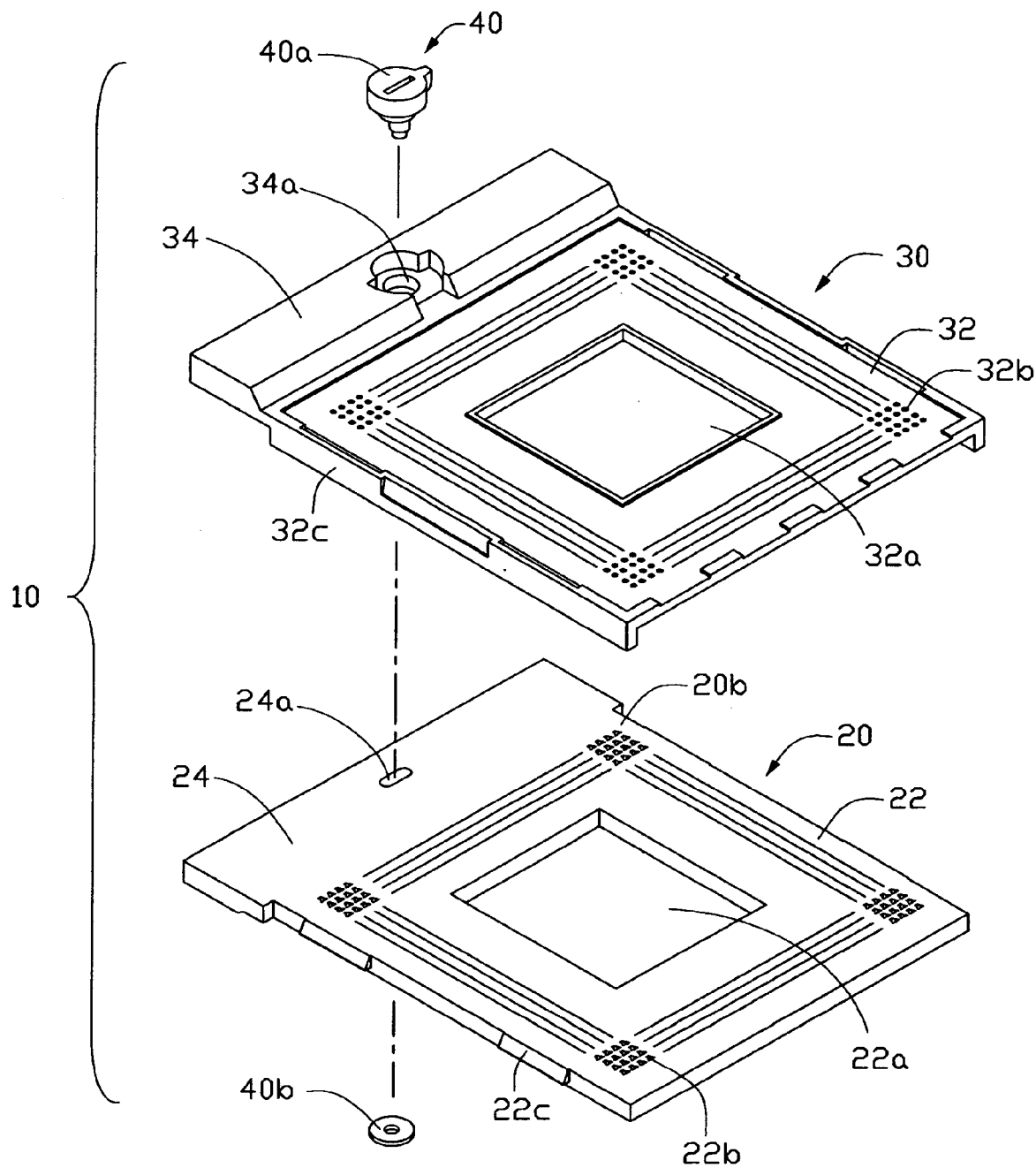
FIG. 1 is an exploded, isometric view of a socket connector according to the present invention.

Referring to the drawings in detail, and first to FIG. 1, there is shown an exploded, isometric view of a socket connector 10 according to the present invention. The socket connector 10 is mainly for electrically interconnecting an integrated circuit (IC) package with a printed circuit board (PCB) (not shown), and comprises a base 20, a plurality of contacts (not shown) received in the base 20, a cover 30 slidably mounted on the base 20, and an actuating device 40 movably embedded in the base 20 and the cover 30.

Figure 2:
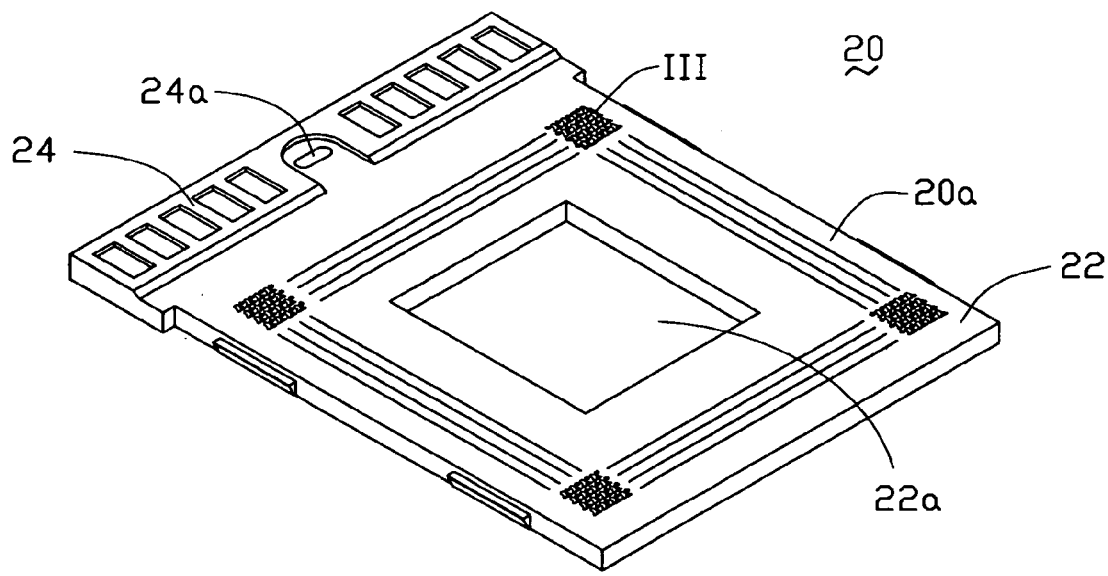
FIG. 2 is an isometric view of a base of the socket connector of FIG. 1, showing the base inverted.

Referring also to FIG. 2, the base 20 has a substantially rectangular configuration. The base 20 defines a mounting surface 20a for mounting the socket connector 10 onto the PCB, and a mating surface 20b for mounting of the cover 30 thereon. The base 20 comprises a substantially rectangular passage body 22, and a substantially oblong head 24 extending from one end of the passage body 22. A rectangular cavity 22a is defined in a center of the passage body 22. A rectangular array of passages 22b is defined in the passage body 22, the passages 22b surrounding the cavity 22a. Further, a pair of protruding blocks 22c projects outwardly from each of opposite lateral sides of the passage body 22. An aperture 24a is defined substantially in a center of the head 24, for positioning the actuating device 40 therein.

Figure 3:
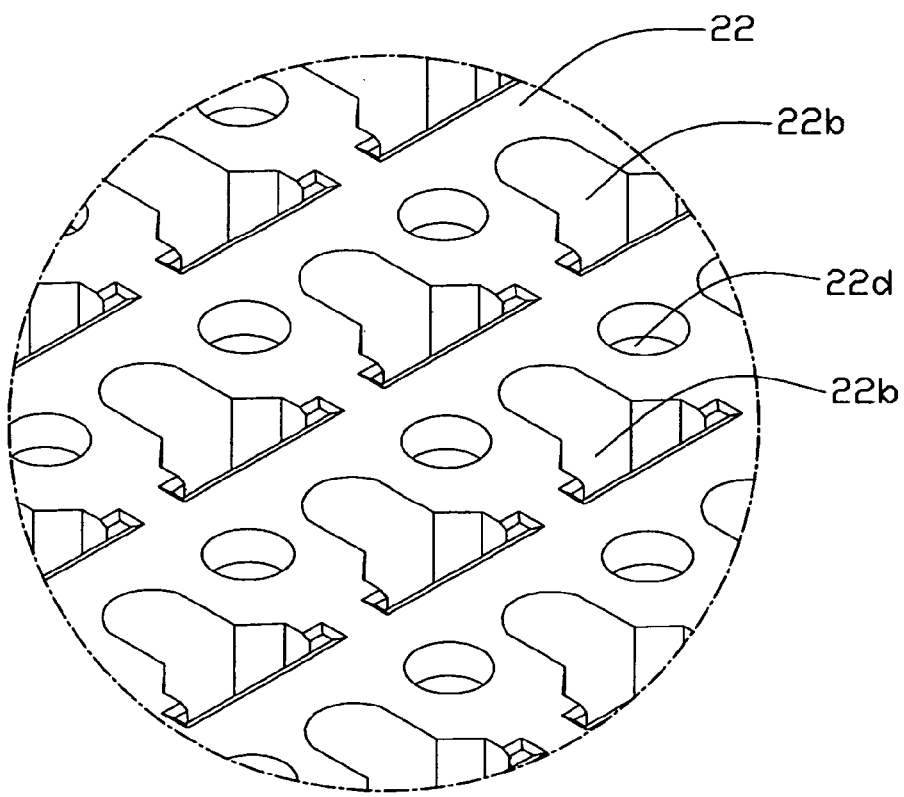
FIG. 3 is an enlarged view of a circled portion III of FIG. 2.
Figure 4:
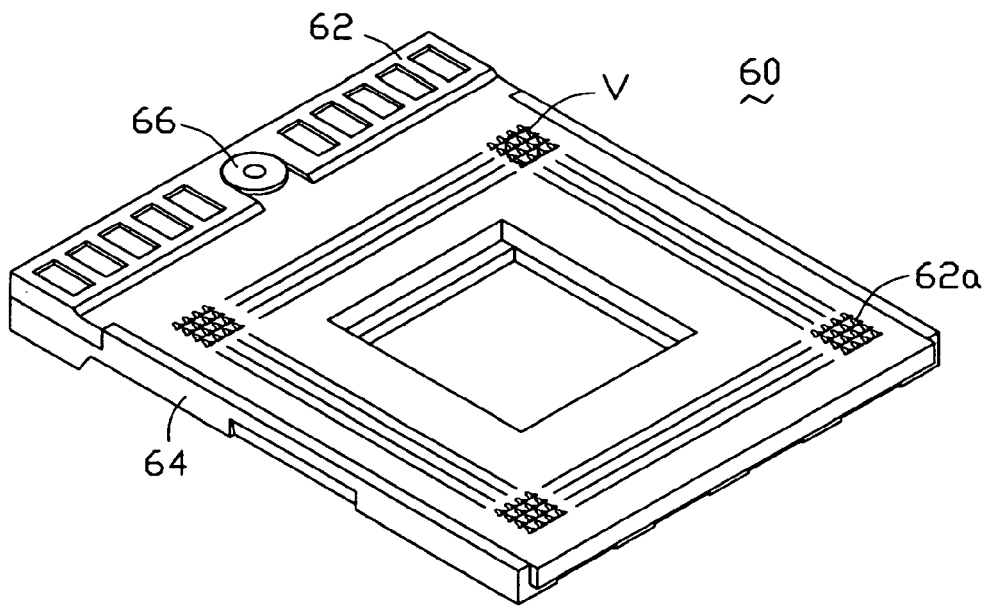
FIG. 4 is an isometric view of a conventional socket connector, showing the connector inverted.
Figure 5:
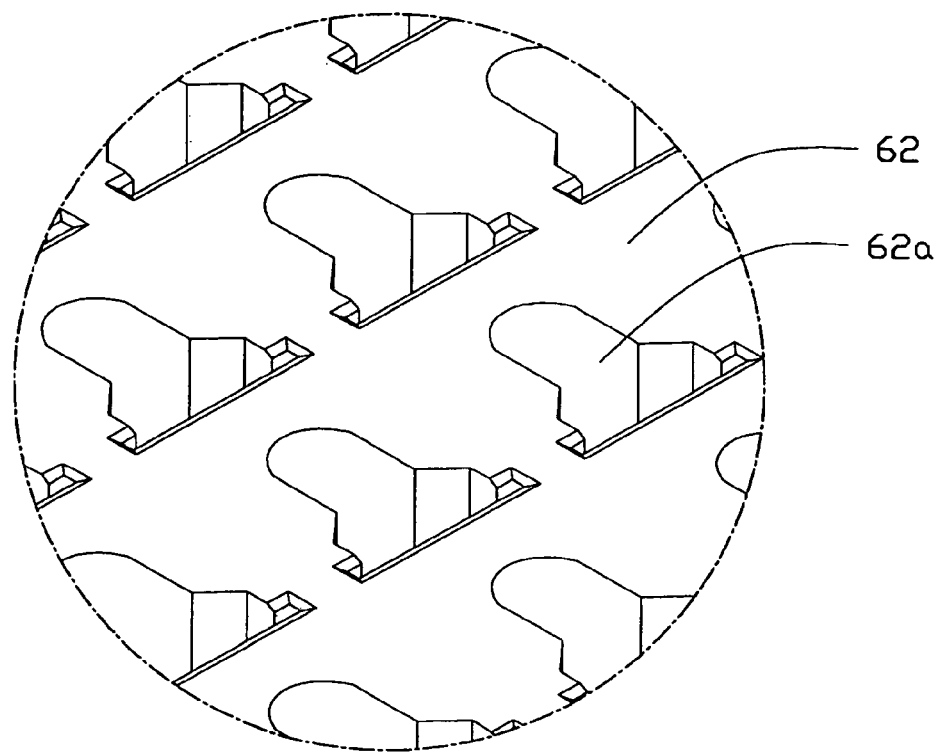
FIG. 5 is an enlarged view of a circled portion V of FIG. 4.

Referring to FIG. 3, each passage 22b has a substantially "T"-shaped profile when viewed from a top elevation. A plurality of concavities 22d is defined in the mounting surface 20a. Each concavity 22d is defined between two adjacent passages 22b in a same row of the passages 22b. With this configuration, each concavity 22d is surrounded by four passages 22b; two of the passages 22b being in a same row as the concavity 22d, and two of the passages 22b being in a row adjacent said same row. In the preferred embodiment of the present invention, the concavity 22d is cylindrical. With this configuration, the passage body 22 has a substantially uniform thickness at the mounting surface 20a to a depth of the concavities 22d.

Referring to FIG. 1, the cover 30 is for slidably mounting on the mating surface 20b of the base 20. The cover 30 comprises a passageway body 32 and a nob 34, corresponding to the passage body 22 and the head 24 of the base 20 respectively. An opening 32a is defined in the passageway body 32, corresponding to the cavity 22a of the base 20. A plurality of passageways 32b is defined in the cover 30, the passageways 32b being aligned with the corresponding passages 22b. Further, a pair of flanks 32c depends from opposite lateral sides of the passageway body 32 respectively. A pair of cutouts (not visible) is defined in an inside of each flank 32c, for receiving the corresponding protruding blocks 22c therein and thereby retaining the cover 30 on the base 20. A bore 34a is defined in the nob 34, corresponding to the aperture 24a of the base 20.

The actuating device 40 comprises an actuating member 40a having a cam function for urging the cover 30 to slide relative to the base 20, and a washer 40b for positioning the actuating member 40a in the aperture 24a of the base 20 and the bore 34a of the cover 30.

After molding of the base 20, because the thickness of the passage body 22 at the mounting surface 22a is substantially uniform, the passage body 22 cools down uniformly thereat, and thereby effectively prevents inner stresses from being created therein. When the socket connector 10 is soldered onto the PCB, the base 20 retains its original configuration. In use, the contacts are easily and reliably retained in their correct positions in the corresponding passages 22b of the base 20. The socket connector 10 thus provides secure electrical connection between the IC package and the PCB.

In the above-described preferred embodiment, each concavity 22d is defined substantially between four surrounding passages 22b of the base 20, and is cylindrical. It should be understood that the shape of each concavity 22d may be varied. Alternative shapes such as rectangular or elliptical configurations can be adopted. The shape adopted depends in part on a structure of the particular connector being produced, and the particular conditions under which the connector is to be made and used.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector comprising:
a base defining a mating surface and a mounting surface and an array of passages spanning between the mating surface and the mounting surface, the passages being arranged in an array comprising substantially parallel rows; any two adjacent of the passages in each row and two adjacent passages in an adjacent row cooperatively defining an area therebetween;
wherein the base defines a plurality of concavities at the mounting surface, said area is surrounded by four corresponding passages and defines one corresponding concavity, for facilitating uniformity of thickness of the base at the mounting surface;
wherein each of the concavities is cylindrical;
wherein the base defines an opening surrounded by the array of the passages.

2. The socket connector of claim 1,
wherein the passage body defines two protruding blocks on each of opposite lateral sides thereof.

3. The socket connector of claim 2, wherein the head defines an aperture therein.

4. A socket connector comprising:
a base defining a mating surface and a mounting surface and an array of passages spanning between the mating surface and the mounting surface, the passages being arranged in an array including columns and rows, each of said passageways defining a portion in the mounting surface, said portion including a larger section and a smaller section; wherein
the base defines a plurality of concavities at the mounting surface, each concavity being located closer to the smaller section of the neighboring passageway than the larger section thereof for facilitating uniformity of thickness of the base at the mounting surface;
wherein the base forms a unit between any passages standing on two adjacent rows and two adjacent columns, said unit defines one corresponding concavity.

5. An electrical connector comprising:
a dielectric substrate having an upper surface and a lower surface and defining a region between the upper and lower surfaces, the region defining a plurality of through holes; and
the region defining a plurality of separated concavities in the lower surface, said plurality of separated concavities being dispersed among said through-holes to facilitate uniformity of thickness of the region at the lower surface;
wherein through holes are arranged in rows and columns, the region defines an area between any through holes standing on two adjacent rows and two adjacent columns, the area defines one of said plurality of separated concavities.

* * * * *